United States Patent [19]

Walker et al.

[11] Patent Number: 5,428,252

[45] Date of Patent: Jun. 27, 1995

[54] POWER SUPPLY INTERRUPTION DETECTION AND RESPONSE SYSTEM FOR A MICROCONTROLLER

[75] Inventors: Andre B. Walker, Los Gatos; Victor So, San Jose, both of Calif.

[73] Assignee: Zilog, Inc., Campbell, Calif.

[21] Appl. No.: 817,465

[22] Filed: Jan. 3, 1992

[51] Int. Cl.⁶ .................... H02J 9/00; G11C 14/00
[52] U.S. Cl. ...................................... 307/64; 365/229
[58] Field of Search ............... 307/66, 64; 395/750; 340/636; 364/707; 365/228, 229, 227

[56] References Cited

U.S. PATENT DOCUMENTS

| | | | |
|---|---|---|---|
| 4,227,257 | 10/1980 | Sato | 307/64 X |
| 4,422,163 | 12/1983 | Oldenkamp | 365/229 |
| 4,451,742 | 5/1984 | Aswell | 307/66 |
| 4,534,018 | 8/1985 | Eckert et al. | 364/900 X |
| 4,591,782 | 5/1986 | Germer | 365/228 X |
| 4,677,311 | 6/1987 | Morita | 307/66 |
| 4,701,858 | 10/1987 | Stokes et al. | 371/66 X |
| 4,716,463 | 12/1987 | Stacy et al. | 364/707 X |
| 4,907,183 | 3/1990 | Tanaka | 364/707 |

OTHER PUBLICATIONS

"The Encyclopedia of Electronic Circuits", Rudolf F. Graf, p. 123, FIG. 12-7, Tab Books Inc., 1985.

IEEE Standard Dictionary of Electrical and Electronics Terms, ANSI/IEEE STD 100-1984, p. 661.
IBM Technical Disclosure Bulletin, vol. 29 No. 6 Nov. 1986, pp. 2641-2643.

*Primary Examiner*—Brian K. Young
*Assistant Examiner*—Fritz M. Fleming

[57] ABSTRACT

A microcontroller power management system wherein the voltage of a power supply is monitored and the microcontroller central processing unit ("CPU") receives an interrupt signal when the supply voltage falls below a predetermined level. The CPU monitors the duration of the low voltage condition and switches into a sleep mode, after storing any data in its registers that are not maintained in the sleep mode, when that duration exceeds a fixed limit that indicates more than a temporary power glitch is being experienced. If only a short power glitch, the CPU continues normal operation. A large capacitor connected to the power supply input to the microcontroller provides enough energy for the microcontroller to operate normally during short glitches and to operate in a sleep mode for a considerable time, thereby maintaining data in CMOS static RAM until power is restored. This is particularly useful for battery operated systems, responding to both a low battery voltage condition and to a complete loss of power during battery replacement.

17 Claims, 3 Drawing Sheets

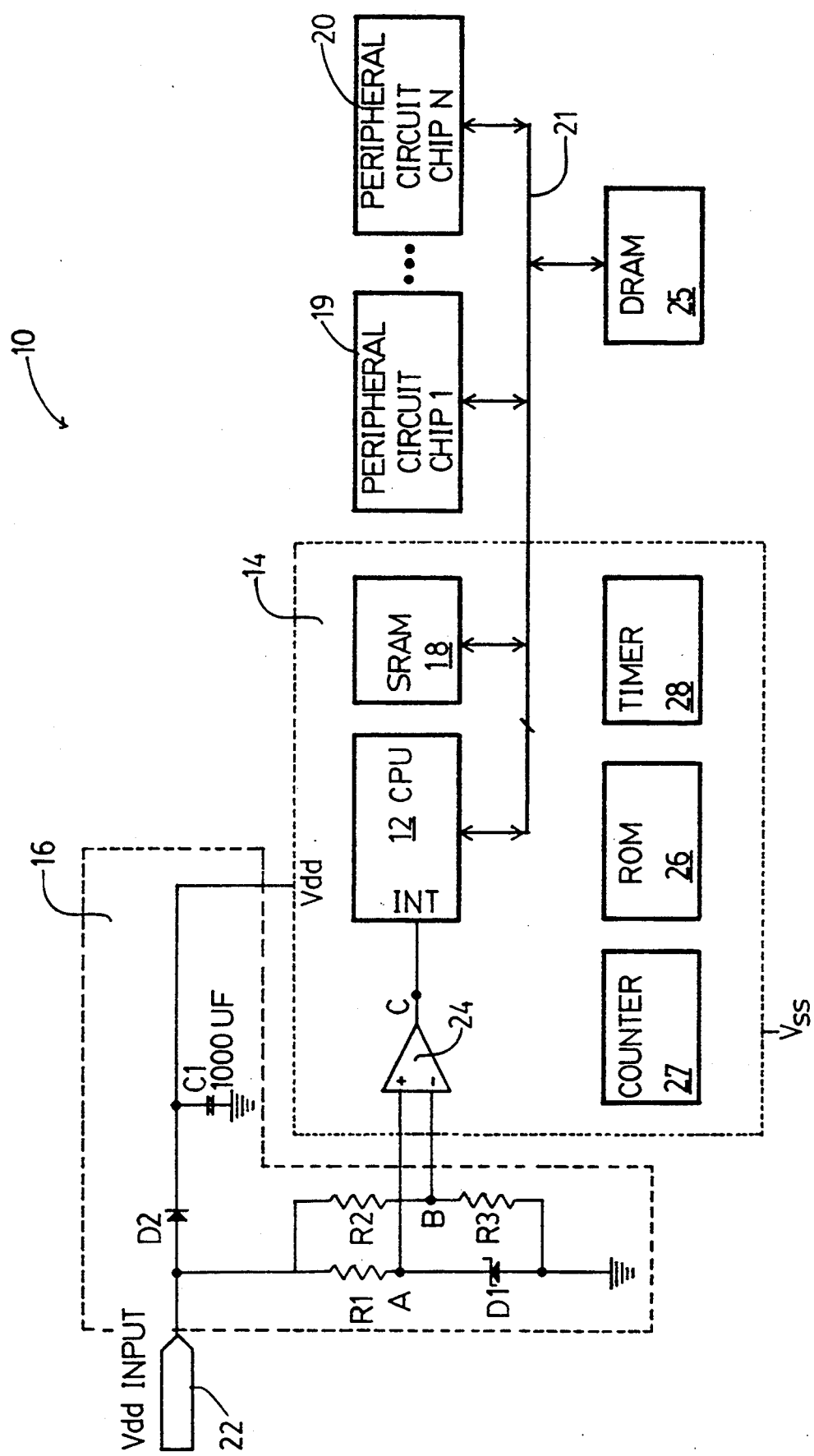
FIG_1

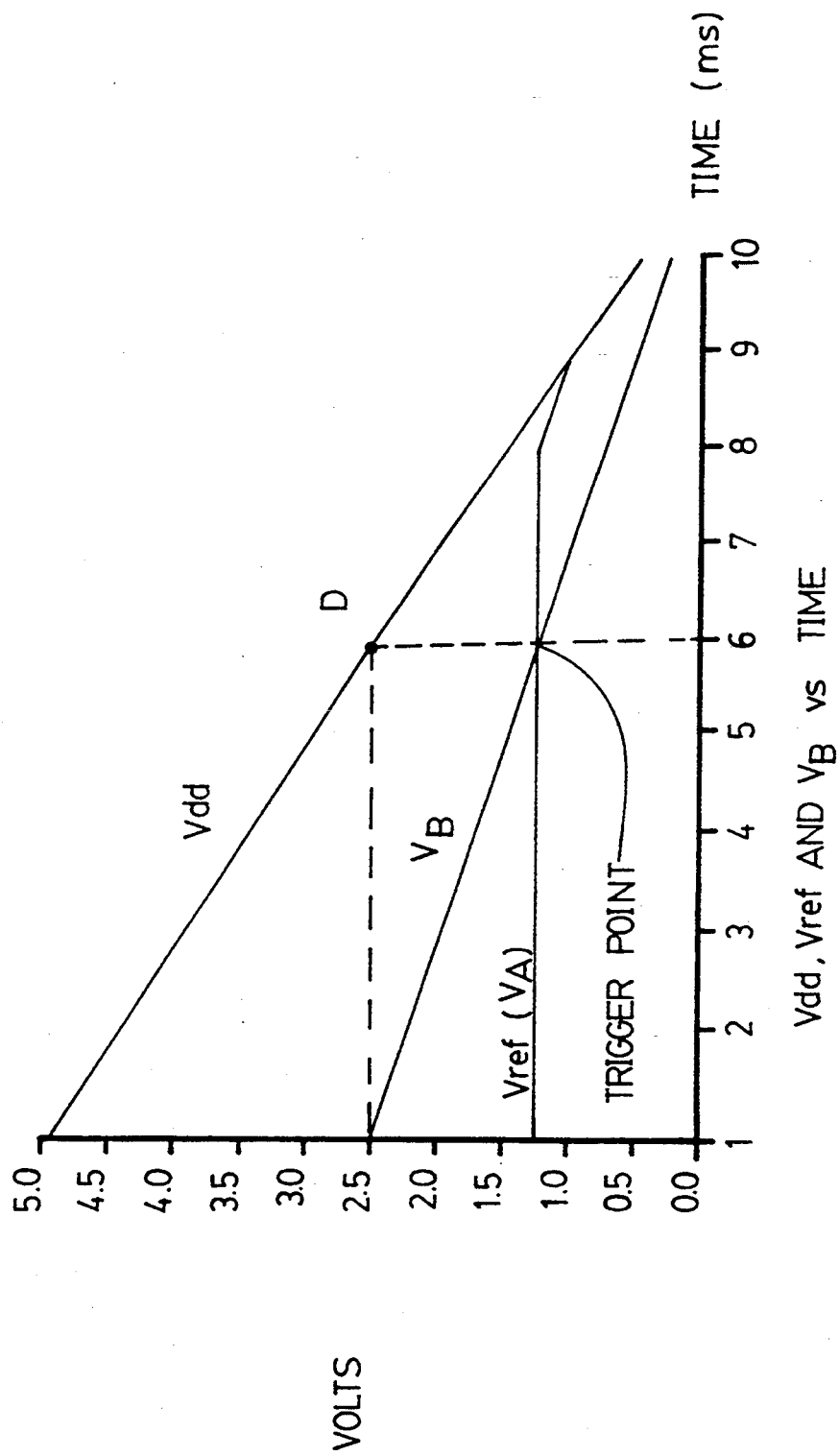
FIG._2

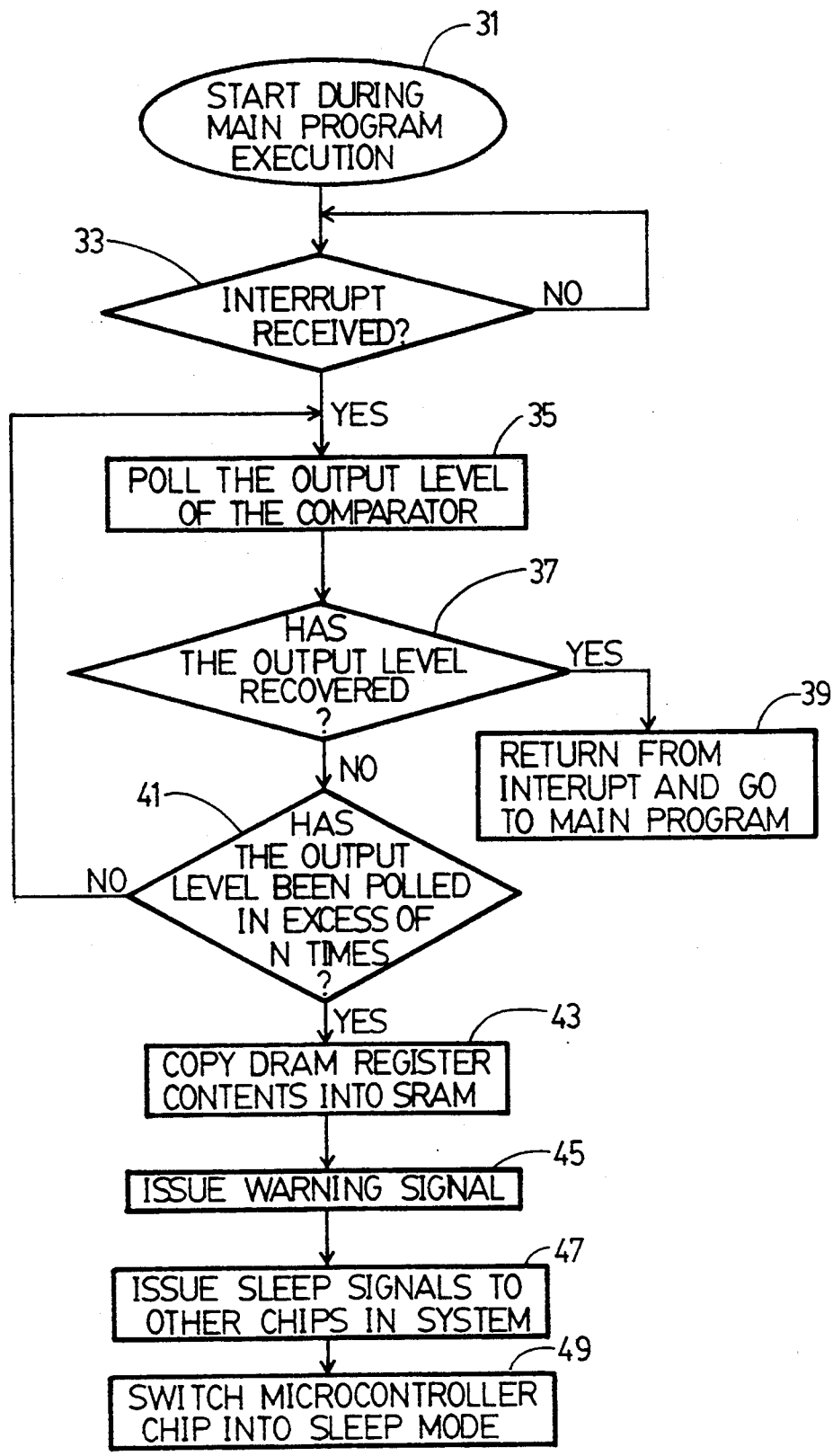
FIG._3

POWER SUPPLY INTERRUPTION DETECTION AND RESPONSE SYSTEM FOR A MICROCONTROLLER

BACKGROUND OF THE INVENTION

This invention relates to a power management system. More specifically, this invention relates to a circuit and an associated power management technique to detect and respond to changes in the power supplied to a system of one or more integrated circuit devices.

Microprocessor and microcontroller based systems are obviously dependent upon a continuous supply of electrical power for their operation, which may be from a line source, a battery, a local generator, or the like. A primary effect of an insufficient voltage level being supplied to integrated circuits of such a system is the loss of data in volatile memory. Inevitable occasional disruptions in the power supply are desirably handled in a manner that minimizes such effects. Such power disruptions include short power glitches, a total removal of power, such as occurs during power outages when a line source is used or when a battery is removed from a battery supplied system, and, in the case of a battery supply, when the voltage of the battery declines over time below a level sufficient to operate the circuits. Further, a rapid change in voltage supply level may also damage integrated circuits if not handled properly.

There are many standard approaches for eliminating or reducing such undesirable effects of a power supply interruption. For example, when a digital clock is unplugged, oftentimes the clock is equipped with a backup battery to permit the clock to continue operating. The clock might continue to work for about thirty minutes, obviating the need for reprogramming once it is plugged in again. Likewise, some television sets are equipped with a battery to permit storage of the contents of programmed channels or other user defined values. Thus, the television does not have to be reprogrammed once the power is resupplied. While the use of a battery as a backup power source is advantageous, it is inefficient. The battery must be periodically replaced, which is potentially expensive, and the back-up battery may not always be charged enough to properly compensate for a loss of power. A back-up battery is therefore unreliable and not cost effective for use in power management.

Another situation that is encountered is a complete loss of power where a battery backup cannot be used or is not practical. And in battery supplied systems, such as with a hand held television remote control device, the effects of a low battery voltage or the removal of the batteries altogether provides a disruption which must somehow be handled.

Therefore, it is a general object of the invention to provide a novel power management system which will obviate or minimize difficulties of the type previously described.

It is a specific object of the invention to provide a power management system which detects changes in power supply voltage.

It is yet another object of the invention to provide a circuit for use in a power management system which does not require a power source other than the main power input.

SUMMARY OF THE INVENTION

This and additional objects are accomplished by the various aspects of the present invention wherein, briefly and generally, a circuit is provided to monitor the voltage of the power being supplied to a system of a type including a microprocessor or microcontroller which responds to a low power supply voltage being detected by the circuit in a manner dependent upon the type of power disruption that is occurring. An external short term substitute voltage supply is also provided, such as by the use of a large capacitor that remains charged by the power supply until it is disrupted. The substitute voltage supply is made sufficient to allow the system to continue regular operation during short term power glitches. The microprocessor or microcontroller detects whether a disruption is a short term glitch, where no power management response is required on its part, or whether it is of a longer term, that is likely to exceed a period where full system operation can be supplied by the substitute voltage supply. In the later case, the microprocessor or microcontroller acts to quickly effect an orderly transition of the system into a sleep mode where the substitute voltage supply may maintain data stored in volatile memories for an extended period until the power is restored.

DESCRIPTION OF THE DRAWINGS

Other features and advantages of the present invention will become apparent from the following detailed description of a preferred embodiment thereof which should be taken in conjunction with the accompanying drawings, wherein:

FIG. 1 is a schematic diagram showing the circuit of the present invention and its relationship to a microcontroller system;

FIG. 2 include curves depicting the relationship of a reference voltage to the operation of the circuit of FIG. 1; and FIG. 3 is a flow diagram that illustrates operation of the system in response to the circuit shown in FIG. 1 detecting a low voltage condition.

DETAILED DESCRIPTION OF THE INVENTION

Referring initially to FIG. 1, a computer system 10 is generally illustrated and includes a single integrated circuit microcontroller 14 that has a central processing unit ("CPU") 12 and is connected to a power supply voltage level detection circuit 16. In the embodiment shown, the microcontroller 14 include a static random access memory ("SRAM") unit coupled to the CPU. The microcontroller may also include various counters, timers, ports and other standard microcontroller components, such as, for example, counter 27 and timer 28. An example of such a circuit chip 14 that is commercially available is a Z8 microcontroller from Zilog, Inc., assignee of the present application. Such a microcontroller is connected in a system with other circuit chips, such as chips 19 and 20 shown, over a system bus 21. The nature of these other circuit chips depends, of course, on the purpose and application of the system. Additionally, as shown in FIG. 1, the microcontroller may be connected to at least one DRAM memory bank as shown, for example, by DRAM block 25.

The circuit 16 is used to detect a low voltage condition power supplied by at an input 22. The voltage input 22 may be from a battery, a line source or a local generator. The circuit 16, in combination with a power management routine executed by the CPU 12, has three main functions. One is to detect a short term power glitch, another a low battery voltage condition, and another a long term absence of voltage (power down). Low battery detection obviously occurs only in applications having a battery supplying voltage to the input 22.

The circuit 16 operates along with a comparator 24 to provide a warning signal at its output to the CPU 12 when a low voltage condition exists. The $V_{dd}$ input 22 is coupled to two resistors R1 and R2. Resistor R1 is coupled to a Zener diode D1 at a node A. The diode D1 is coupled to ground as shown. The Zener diode is used to set the low battery/power loss detection voltage and maintains an essentially constant voltage at node A despite variations in the voltage supplied at the input 22. The voltage at node A is used as a reference voltage of the circuit. The user may choose the reverse breakdown voltage of the Zener diode and R2, and R3 to define the reference voltage at which a power disruption will be considered to have occurred. Thus, in the case of a battery input, the Zener diode D1 is targeted to half the expected "dead" voltage, which is about 1.1 volts for two 1.5 volt batteries connected in series, for example. Resistor R1 has a high impedance of approximately 100 kOhms to a few MOhms to permit node A to be relatively unaffected by changes in the input voltage 22.

The resistor R2 is coupled in series to a third resistor R3 at a node B to form a voltage divider. Resistors R2 and R3 have substantially the same impedance. Thus, the voltage at node B is directly proportional to the input 22 and may be compared to the voltage at node A. The comparator 24 carries out this comparison. If the voltage at node B is greater than the reference voltage established at node A, the comparator will not issue a warning signal at node C to the CPU, and operation of the system will proceed normally. However, if the voltage at node B, which again is proportional to the voltage $V_{dd}$ at the input 22, is less than or equal to the referenced voltage established at node A, the comparator will provide a low power signal at its node C output. This signal is preferably utilized by connection to a hardwired interrupt (INT) input available as part of the CPU. Thus, when a warning signal is given to the CPU, it responds immediately. As described below, the CPU analyzes the nature of the interruption and takes any necessary steps to minimize its effect on the system.

A large capacitor C1, such as 1000 microfarads in value, is coupled between a $V_{dd}$ supply input to the microcontroller 14 and ground potential. The capacitor C1 stores a small amount of power for use in the event of a power loss. A diode D2 in series with the voltage supply 22 and the $V_{dd}$ input to the microcontroller 14 prevents discharge of the capacitor C1 through other portions of the circuit 16 during power interruptions. If a power loss occurs, the charge stored at C1 is used to permit the microcontroller to continue normal operation through short term glitches and, in the case of longer interruptions, to quickly perform a few operations which will facilitate resumption of normal processing once power is fully restored. As described below, the system can be switched into an available sleep mode that maintains the contents of volatile memory elements for some period of time, such as one-half hour. This is the result of the circuits being formed primarily of CMOS elements which consume very little power when inactive. The value of the capacitance C1 may of course be changed to increase or decrease the amount of charge stored and supplied to the microcontroller during a power loss.

As shown in FIG. 1, the microcontroller 14, including comparator 24, CPU 12 and the SRAM unit 18, are all fabricated on a single integrated circuit. However, resistors R1, R2, and R3 and Zener diode D1 may also be fabricated on the same circuit chip. The circuit 16 thus provides a means of compactly managing power without need for a backup power source such as a battery. The capacitor C1 and diode D2 are kept off the chip because of the size of the capacitor. A high density capacitor, such as one commonly known in the industry as a "gold-cap" is effective in this application.

Referring now to FIG. 2, shown is a graph of the voltage at node A (line $V_{ref}$), node B, and $V_{dd}$ versus time measured in milliseconds. In the embodiment illustrated in FIG. 2, $V_{dd}$ is initially 5 volts and is shown to steadily decrease as part of a power failure, as shown by the line labelled $V_{dd}$ on the graph. Assume that resistors R1, R2, and R3 are all 500 kOhms. The voltage divider (R2, R3) produces a voltage at node B which is one-half of the input voltage, as shown by the line $V_B$ on the graph. The reference voltage at which a warning signal should be issued is usually set to be one-half of the maximum input voltage. If the input voltage $V_{dd}$ is 5 volts, the voltage at which a warning signal should be issued is at $V_{dd}$=2.5 volts. The point at which the warning signal is issued is labelled D in FIG. 2. Since the voltage at $V_B$ is one-half the voltage of $V_{dd}$, the warning signal issues when $V_B$=1.25 volts. Thus, the Zener diode D1 maintains a voltage at node A ($V_{ref}$) of 1.25 volts. When the voltage at node B drops below the reference voltage of 1.25 volts at node A, the comparator changes its output polarity to issue a warning signal at node C at a time of 6 milliseconds, shown by the dotted vertical line on the graph of FIG. 2.

Referring to FIG. 3, the process of the CPU 12 in response to the interrupt signal at node C is shown. Software code to implement this process is most conveniently mask programmed into a read-only-memory ("ROM") 26 provided as part of the microcontroller 14. A block 31 indicates that the CPU 12 is executing its normal operating program, from which it is diverted upon the interrupt signal at node C being received, as indicated by a block 33. That interrupt indicates that the voltage of the power supply source has fallen below the threshold level of the Zener diode D1. A next step 35 causes the CPU 12 to check back a few clock cycles later to see if the low-voltage warning interrupt signal at node C is still present. If not, as indicated by block 37, the voltage supply is detected to have recovered quite quickly, and it is thus known that only a short term power glitch occurred. Since the capacitor C1 can supply enough power to operate the microcontroller 14 during such a power glitch, no operational changes occur. Execution of the main program is then resumed, as indicated by a block 39.

However, if the voltage supply has not recovered by the time it is monitored, indicated by the blocks 35 and 37, a next step, indicated by a block 41, is to count the number of times that the interrupt signal has been checked since it was first detected. When the checking operation of block 35 has occurred N number of times without the voltage source being restored, then the power management system proceeds to other steps. The number N of times that the steps 35 and 37 are carried out is related to the length of typical glitches which are desired to be ignored, and the storage capacity of the temporary voltage supply source of the capacitor C1. Very typically, this checking will continue for a time period in the range of 1-5 milliseconds.

Once this time has been exceeded, the power management system proceeds to a next step, 43, where the CPU 12 takes measures to preserve any volatile data that exist in its registers at the time. Typically, such data is written from those registers into SRAM 18. The process is made to occur as rapidly as possible since the microcontroller 14 may be, during this period, operating off only the limited amount of power provided by the capacitor C1. It is desired that the capacitor has enough energy remaining at that time, that the system can put itself to sleep, in order to provide the small amount of power necessary to maintain the data in the CMOS SRAM 18.

In the case of a battery operated system where the power management routine is initiated by a low voltage being detected, there is more energy available for such operations from the batteries, but the system being described is designed for a worst case when power is totally removed from the system, such as occurs by removal of batteries, in a battery operated system, or loss of line power in the case of a system plugged into an electrical distribution network.

Before going to sleep, the CPU 12 may issue an external warning signal, as indicated by a block 45, that is utilized by some other chip of the system. One such chip may provide a signal to alert its user of the condition. This is useful when the condition is prompted by a low battery voltage, but is likely not to be effective when power is totally disconnected from the system, since there will not be enough energy to drive a warning indicator.

A second optional operation that may occur before the system goes to sleep is indicated in a block 47. The CPU 12 can issue sleep signals over the system bus 21 to other integrated circuit chips in the system, such as the circuits 19 and 20 illustrated in FIG. 1.

Thereafter, as indicated by a block 49, the microcontroller 14 itself is switched into its sleep mode where, because of its predominantly CMOS structure, very little energy is consumed.

It should be noted that although the invention has been described with reference to specific embodiments it should not be construed to be so limited. Those skilled in the art and familiar with the instant disclosure of the subject invention may recognize additions, deletions, modifications, substitutions and other changes which will fall within the scope of the appended claims.

What is claimed is:

1. A power management system as part of a microcontroller, said microcontroller having a voltage supply input adapted to be connected with a power supply terminal, and having both a normal operating mode and a sleep mode, said system comprising:
   means operably connected to said microcontroller power supply terminal for issuing a warning signal when a voltage level at said terminal falls below a predetermined level,
   a single short term source of an operating voltage connected to said microcontroller voltage supply input, said short term source being devoid of a backup battery supply, and
   means controlling operation of the microcontroller and responsive to said warning signal for continuing the microcontroller's said normal operating mode when said warning signal has a duration of less than a predetermined time, wherein said short term operating voltage source is adequate to maintain the normal operating mode, and for switching into the microcontroller's sleep mode when said warning signal has a duration of more than said predetermined time, wherein said short term operating voltage source is adequate to maintain the sleep mode for a time,
   wherein said microcontroller operation controlling means is also responsive to said warning signal having a duration of more than said predetermined time for copying at least some contents of dynamically refreshed volatile memory into static volatile memory prior to the microcontroller switching into its sleep mode.

2. The system according to claim 1 wherein said warning signal issuing means includes a reference voltage source related to said predetermined level and a comparator having a first input operably connected to said reference voltage source and a second input operably connected to said power supply terminal, an output of said comparator providing said warning signal when the second input voltage is less than the first input voltage.

3. The system according to claim 2 wherein said reference voltage source includes a series circuit of a Zener diode and a resistance connected between said power supply terminal and ground potential, a node between said resistance and said diode being connected to said first comparator input, thereby to provide said reference voltage.

4. The system according to claim 3 wherein said warning signal issuing means additionally includes a series circuit of two additional series resistances connected between said power supply terminal and ground potential, a node of connection between them being connected to said second comparator input.

5. The system according to claim 1 wherein said short term operating voltage source includes a capacitor connected between said microcontroller voltage supply input and ground potential.

6. The system according to claim 5 wherein said microcontroller power supply input is connected to said power supply terminal through a blocking diode.

7. The system according to claim 1 wherein said microcontroller operation controlling means includes means for accumulating a number of N times said warning signal occurs with a duration of less than said predetermined time, said number of N times being adjustably related to the length of typical power glitches which are desired to be ignored, and also being adjustably related to a storage capacity of said short term source.

8. The system according to claim 7 wherein said microcontroller contains a hardwired interrupt input to immediately detect issuance of said warning signal.

9. The system according to claim 1 wherein said microcontroller operation controlling means is also responsive to said warning signal having a duration of more than said predetermined time for issuing a power failure signal external of said microcontroller, whereby said power failure signal is used to cause other integrated circuit chips to switch into their respective sleep modes.

10. The system of claim 1 wherein said predetermined time is in the range of 1-5 milliseconds.

11. A circuit for detecting changes in the power delivered to an associated microprocessor by a primary power source, said circuit being fabricated on a semiconductor chip, said circuit comprising:

a first node having a first voltage for providing a reference voltage;

a second node having a second voltage responsive to the input voltage delivered by the primary power source;

comparator means for comparing said first voltage to said second voltage, said comparator means issuing a first signal to the microprocessor when said second voltage is less than or equal to said first voltage;

a single short term source of an operating voltage connected to a voltage supply input of said microprocessor, said short term source adapted to maintain a normal operating mode of said microprocessor for a time, said short term source further adapted to maintain a sleep mode of said microprocessor for another time, said short term source further being devoid of a backup battery supply; and memory means including static volatile memory for copying and storing at least some contents of dynamically refreshed volatile memory into said static volatile memory.

12. A power management system for use with a microprocessor, said microprocessor being fabricated on an integrated circuit and being powered by an external power source, said system comprising:

a first node having a first voltage for providing a reference voltage;

a second node having a second voltage responsive to the input voltage delivered by the power source;

comparator means for comparing said first voltage to said second voltage, said comparator means issuing a first signal to a microprocessor when said second voltage is less than or equal to said first voltage;

a single short term source of an operating voltage connected to a voltage supply input of said microprocessor, said short term source adapted to maintain a normal operating mode of said microprocessor for a time, said short term source further adapted to maintain a sleep mode of said microprocessor for another time, said short term source further being devoid of a backup battery supply;

diode means for separating said short term source from said first node and said second node such that said nodes may accurately detect a drop in or loss of input power;

means responsive to the occurrence of said first signal for periodically checking said first signal in order to determine its duration; and means including a static volatile memory, and responsive to said checking means for copying and storing at least some contents of temporary registers into said static volatile memory if the first signal continues in excess of a preset amount of time.

13. A method for managing a computer system when a supply voltage to the system falls below a predetermined level, said system having a microcontroller, said microcontroller including a voltage supply input adapted to be connected with a power supply terminal, and having both a normal operating mode and a sleep mode, said system further including a single short term source of an operating voltage connected to said microcontroller voltage supply input, said short term source being devoid of a battery backup power source, said method comprising the steps of:

(a) comparing a voltage level at a reference voltage source to a voltage level at said power supply terminal;

(b) issuing a warning signal in response to said comparison when the voltage level at said terminal falls below the voltage level at said reference voltage source;

(c) supplying said short term source operating voltage to said microcontroller to maintain said normal operating mode while said warning signal has a duration of less than a predetermined time;

(d) copying at least some contents of dynamically refreshed volatile memory into static volatile memory prior to switching said microcontroller into its sleep mode, (e) switching said microcontroller into its sleep mode when said warning signal has a duration of more than a predetermined time, and (f) supplying said short term source operating voltage to said microcontroller voltage supply input to maintain said sleep mode for a time.

14. The method of claim 13 wherein said predetermined time is in the range of 1–5 milliseconds.

15. A method for managing a computer system when a supply voltage to the system falls below a predetermined level, said system having a microcontroller, said microcontroller having both a normal operating mode and a sleep mode, wherein said microcontroller includes a voltage supply input adapted to be connected with a primary power supply terminal, and further includes a comparator having a first input operably connected to a reference voltage source which is related to said predetermined level and a second input operably connected to said power supply terminal, said system further including a single short term source of an operating voltage connected to said voltage supply input of the microcontroller, said short term source being devoid of a battery backup power source, said method comprising the steps of:

(a) receiving a warning signal issued by said comparator, said warning signal indicating that the primary supply voltage to the system has fallen below said predetermined level;

(b) supplying said short term source operating voltage to said microcontroller to maintain said normal operating mode;

(c) checking to see if the warning signal is still being issued by said comparator;

(d) accumulating a number of N times that said warning signal has been checked;

(e) returning to step (c) if the accumulated number N of step (c) is less than a predetermined value;

(f) if the accumulated number N is at least equal to said predetermined value, copying at least some contents of dynamically refreshed volatile memory into static volatile memory prior to switching said microcontroller into its sleep mode;

(g) switching said microcontroller into its sleep mode when the accumulated number N is at least equal to said predetermined value; and (h) supplying said short term source operating voltage to said microcontroller to maintain said sleep mode for a time, 16. The method of claim 15 further comprising the step of issuing a power failure signal external of said microcontroller prior to switching said microcontroller into its sleep mode, whereby said power failure signal is used to cause other integrated circuit chips to switch into their respective sleep modes.

17. A power management system as part of a microcontroller, said microcontroller having a voltage supply input adapted to be connected with a power supply terminal, and having both a normal operating mode and a sleep mode, said system comprising:

means operably connected to said microcontroller power supply terminal for issuing a warning signal when a voltage level at said terminal falls below a predetermined level, a single short term source of an operating voltage connected to said microcontroller voltage supply input, said short term source being devoid of a backup battery supply;

means controlling operation of the microcontroller and responsive to said warning signal for continuing the microcontroller's said normal operating mode when said warning signal has a duration of less than a predetermined time, wherein said short term operating voltage source is adequate to maintain the normal operating mode, and for switching into the microcontroller's sleep mode when said warning signal has a duration of more than said predetermined time, wherein said short term operating voltage source is adequate to maintain the sleep mode for a time, said microcontroller including a hardwired interrupt input to immediately detect issuance of said warning signal, said microcontroller operation controlling means including means for accumulating a number of N times said warning signal occurs with a duration of less than said predetermined time, said number of N times being adjustably related to the length of typical power glitches which are desired to be ignored, and also being adjustably related to a storage capacity of said short term source, wherein said microcontroller operation controlling means is also responsive to said warning signal having a duration of more than said predetermined time for copying at least some contents of dynamically refreshed volatile memory into static volatile memory prior to the microcontroller switching into its sleep mode, and wherein said microcontroller operation controlling means is also responsive to said warning signal having a duration of more than said predetermined time for issuing a power failure signal external of said microcontroller, whereby said power failure signal is used to cause other integrated circuit chips to switch into their respective sleep modes.

* * * * *